United States Patent
Chou et al.

(10) Patent No.: US 12,084,628 B2
(45) Date of Patent: Sep. 10, 2024

(54) COMPOSITION COMPRISING A PRIMARY AND A SECONDARY SURFACTANT, FOR CLEANING OR RINSING A PRODUCT

(71) Applicant: BASF SE, Ludwigshafen am Rhein (DE)

(72) Inventors: I Chen Chou, Taoyuan (TW); Andreas Klipp, Ludwigshafen (DE); Berthold Ferstl, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 1129 days.

(21) Appl. No.: 16/762,275

(22) PCT Filed: Nov. 26, 2018

(86) PCT No.: PCT/EP2018/082551
§ 371 (c)(1),
(2) Date: May 7, 2020

(87) PCT Pub. No.: WO2019/105889
PCT Pub. Date: Jun. 6, 2019

(65) Prior Publication Data
US 2023/0167381 A1   Jun. 1, 2023

(30) Foreign Application Priority Data
Nov. 28, 2017   (EP) .................. 17204225

(51) Int. Cl.
| | | |
|---|---|---|
| C11D 1/66 | (2006.01) | |
| C11D 1/00 | (2006.01) | |
| C11D 1/722 | (2006.01) | |
| C11D 1/83 | (2006.01) | |
| C11D 3/20 | (2006.01) | |
| C11D 3/24 | (2006.01) | |
| C11D 3/30 | (2006.01) | |
| G03F 7/40 | (2006.01) | |
| H01L 21/02 | (2006.01) | |
| C11D 1/72 | (2006.01) | |

(52) U.S. Cl.
CPC ............... *C11D 1/83* (2013.01); *C11D 1/006* (2013.01); *C11D 1/66* (2013.01); *C11D 1/722* (2013.01); *C11D 3/245* (2013.01); *G03F 7/40* (2013.01); *H01L 21/02057* (2013.01); *C11D 1/004* (2013.01); *C11D 1/72* (2013.01); *C11D 2111/22* (2024.01)

(58) Field of Classification Search
CPC ........... C11D 1/006; C11D 1/72; C11D 1/722; C11D 1/66; C11D 3/245; B08B 3/08; B08B 3/10
USPC ......... 510/175, 245, 256, 505, 506; 134/1.2, 134/1.3
See application file for complete search history.

(56) References Cited

U.S. PATENT DOCUMENTS

| | | | |
|---|---|---|---|
| 4,267,212 | A | 5/1981 | Sakawaki |
| 5,466,389 | A | 11/1995 | Ilardi et al. |
| 9,557,652 | B2 | 1/2017 | Klipp et al. |
| 2012/0111233 | A1 | 5/2012 | Hierse et al. |
| 2018/0201885 | A1 | 7/2018 | Bittner et al. |

FOREIGN PATENT DOCUMENTS

| | | |
|---|---|---|
| GB | 1 573 208 | 8/1980 |
| JP | 50-64208 | 5/1975 |
| JP | 50-101306 | 8/1975 |
| JP | 50-101307 | 8/1975 |
| JP | 59-52520 A | 3/1984 |
| JP | H07297158 A | 11/1995 |
| JP | 2005105045 A | 4/2005 |
| JP | 2016508287 A | 3/2016 |
| WO | WO 2010/149262 A1 | 12/2010 |
| WO | WO 2012/084118 A1 | 6/2012 |
| WO | WO 2012/101545 A1 | 8/2012 |
| WO | WO 2013/022673 A2 | 2/2013 |
| WO | WO 2014/091363 A1 | 6/2014 |
| WO | WO 2015/004596 A1 | 1/2015 |
| WO | WO 2017/009068 A1 | 1/2017 |

OTHER PUBLICATIONS

U.S. Appl. No. 16/756,303, filed Apr. 15, 2020, Loeffler, et al.
International Search Report issued on Feb. 12, 2019 in PCT/EP2018/082551 filed on Nov. 26, 2018.

*Primary Examiner* — Gregory R Delcotto
(74) *Attorney, Agent, or Firm* — Armstrong Teasdale LLP

(57) ABSTRACT

Described is a composition comprising as primary surfactant an ionic compound comprising one or more fluoroalkyl groups and as secondary surfactant at least one non-ionic compound comprising one or more polyalkyloxy and/or polyalkylenoxy groups, for cleaning or rinsing a product, preferably a product used in the semiconductor industry, and a respective use of said composition. Further described is a method of making a cleaned or rinsed product, preferably a product used in the semiconductor industry, comprising a substrate and supported thereon a patterned material layer having line-space structures with a line width of 50 nm or below, comprising the step of cleaning or rinsing said product with the composition of the invention.

13 Claims, No Drawings

COMPOSITION COMPRISING A PRIMARY AND A SECONDARY SURFACTANT, FOR CLEANING OR RINSING A PRODUCT

The present invention relates to a composition comprising as primary surfactant an ionic compound comprising one or more fluoroalkyl groups and as secondary surfactant at least one non-ionic compound comprising one or more polyalkyloxy and/or polyalkylenoxy groups, for cleaning or rinsing a product, preferably a product used in the semiconductor industry, and to the respective use of said composition. The present invention also relates to a method of making a cleaned or rinsed product, preferably a product used in the semiconductor industry, comprising a substrate and supported thereon a patterned material layer having line-space structures with a line width of 50 nm or below, comprising the step of cleaning or rinsing said product with the composition of the invention.

In the process of manufacturing integrated circuits (ICs) with large-scale integration (LSI), very-large-scale integration (VLSI) and ultra-large-scale integration (ULSI), patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide layers, and patterned dielectric material layers containing or consisting of silicon dioxide or low-k or ultra-low-k dielectric materials are produced by photolithographic techniques. Today, such patterned material layers comprise structures of dimensions even below 22 nm with high aspect ratios. These specifications also apply for the present invention as defined herein.

The aspect ratio "H:W" of structures comprised by patterned material layers as referred to herein are characterized—consistent with the usual meaning in the technical field—by the ratio of the height (H) of the features of the patterned material layer and the width (line width, W) of the features of the patterned material layer. A structure with a high aspect ratio therefore is a structure where the value of its height extension is higher than the value of its width extension.

Photolithography is a method in which a pattern cut into a mask is projected onto a substrate, in particular a semiconductor substrate, such as a semiconductor wafer. Semiconductor photolithography typically includes the step of applying a layer of a photoresist on a top surface of a semiconductor substrate and exposing the photoresist to actinic radiation, in particular UV radiation of a wavelength of, for example, 193 nm, through the mask. These principles also apply to the present invention described herein. In order to extend the 193 nm photolithography to the 22 nm and the 15 nm technology node, immersion photolithography has been developed as a resolution enhancement technique. In this technique, the air gap between the final lens of the optical system and the photoresist surface is replaced by a liquid medium that has a refractive index greater than one, e.g. ultrapure water with a refractive index of 1.44 for the wavelength of 193 nm. This technique can also be applied in a process according to the present invention or be used with a composition of the present invention as described herein. However, in order to avoid leaching, water-uptake and pattern degradation, a barrier coating or a water resistant photoresist must be used.

Beside the 193 nm-immersion lithography, other illumination techniques with significant shorter wavelength are considered for fulfilling the needs of further downscaling of the feature sizes to be printed of 20 nm node and below: electron beam (e-Beam) exposure and the Extreme Ultraviolet Lithography (EUV) with a wavelength of approx. 13.5 nm seem to be promising candidates for replacing immersion lithography in the future. After exposure to actinic radiation the subsequent process flow is independent of the photolithographic method used (e.g. UV lithography, immersion photolithography or EUV lithography as described above) and can therefore be used in methods or processes according to the present invention.

Typically, and as known to the skilled person in the field, structures with high aspect ratios and a structure having a line width of 50 nm or below are produced by directing an intense light beam through an optical mask onto a photoresist (i.e. a chemically deposited layer on the substrate). The basic procedure of a photolithographic process is typically and by way of example divided into a number of process steps, e.g. in many cases and situations the following process steps are distinguished:

1) Cleaning of the wafer; 2) Preparation; 3) Photoresist Application; 4) Exposure and Post-Exposure Bake; 5) Developing and Rinsing; 6) Hard-bake; and 7) Follow-up processes, e.g. Plasma Etching.

Subsequent process steps for device manufacturing may typically follow. As is obvious for the skilled person in the field, certain of the process steps as set forth above can be omitted, amended or other process steps can be inserted in addition to the process steps listed above, in order to adapt the photolithographic process to the actual manufacturing needs.

The method and the use according to the present invention are preferably part of a process of making a cleaned or rinsed product comprising a substrate and supported thereon a patterned material layer comprising one or all of the process steps discussed above.

With respect to the basic process of a photolithographic process as disclosed above, the present invention (use, method and composition) preferably relates to process step 5).

In process step 1 (cleaning of the wafer), different chemical treatments are applied to the surface of the wafer so that substances absorbed on the surface of the wafer (contaminations) are removed.

In process step 2 (preparation), the wafer is heated to at least 150° C. in order to remove moisture absorbed on the surface, optionally followed by a treatment with e.g. hexamethyldisilazane (HMDS) in order to passivate ("hydrophobize") the surface (capping remaining OH-groups with methyl-groups). A passivated surface serves the purpose of preventing water from diffusing in between the wafer surface and the photoresist layer at a later stage of the photolithographic process.

In process step 3 (photoresist application), a photoresist layer is deposited onto the wafer by spin coating. A detailed description and discussion of this process step is disclosed in U.S. Pat. No. 4,267,212 A. The thickness of this layer can vary from some 10 nm for EUV resists to some 100 nm for deep ultraviolet (DUV) resists and can reach up to a few micrometers for older resists and micromachining applications. After evaporation of the solvent, the deposited photoresist layer is optionally pre-baked at temperatures typically at around 100° C.

In process step 4, an intense light beam is directed through an optical mask so that only specific spots of the photoresist layer are exposed to the light. Depending on the nature of the photoresist (positive or negative) the exposed or the unexposed regions of the photoresist are removed in the next process step (developing). A post-exposure bake is often performed to help with the chemical amplification of the resist.

In process step 5 (developing and rinsing) and according to the present invention, a developer solution is brought in contact with the photoresist to remove the exposed (positive resist) or unexposed (negative resist) regions of the photoresist layer. A patterned photoresist layer corresponding to the pattern of the optical mask (negative or positive) thus remains on the wafer (substrate). A typical developer solution contains tetramethyl ammonium hydroxide (TMAH) for positive tone resists and/or organic solvents for negative tone resists.

After a suitable time for the developer solution on the resist, the rinsing composition is applied (wet-to-wet) to prevent, remove, or alleviate specific defects (e.g. watermark defects, remaining residuals from the developer solution, pattern collapse). Optionally it is also possible to have an additional water rinse step between the developer solution and the rinse formulation. The application of the rinsing composition is of particularly high relevance with respect to the products having line-space structures with a small line width and high aspect ratio. The substrate is then typically spin-dried after which the substrate is transferred to the next process step.

In process step 6 (hard bake) the wafer as supporting the patterned photoresist layer can optionally be "hard-baked", typically at a temperature of 120 to 180° C. After the hard-bake, the remaining photoresist layer has solidified and is thus more resistant to chemical treatments and/or physical stress.

Follow-up process step 7 (e.g. plasma etching) transfers the targeted architecture of the photoresist into the wafer substrate. The etching step typically removes the dielectric and/or hardmask layer (silicon oxide or low-k layer between the photoresist layer and the wafer (e.g. silicone oxide, titanium nitride, low-k layer (carbon doped silicon oxide)).

Irrespective of the exposure techniques, the wet chemical processing of small pattern as discussed above involves a plurality of problems: As technologies advance and dimension requirements become stricter and stricter, photoresist patterns are required to include relatively thin and tall structures or features of photoresists, i.e., features having a high aspect ratio, on the substrate. These structures may suffer from bending and/or collapsing, in particular, during the cleaning or rinsing process, due to e.g. excessive capillary forces of the liquid or solution remaining from the cleaning or rinsing solution between adjacent photoresist features, in particular during the spin dry processes. The maximum stress σ between small features caused by the capillary forces can be described according to Namatsu et al. Appl. Phys. Lett. 66(20), 1995 as follows:

$$\sigma = \frac{6 \cdot \gamma \cdot \cos\theta}{D} \cdot \left(\frac{H}{W}\right)^2$$

Wherein $\gamma$ is the equilibrium surface tension of the fluid, $\theta$ is the contact angle of the fluid on the substrate having supported thereon the patterned material layer, i.e. the contact angle of the fluid with the structures of e.g. the photoresist (also referred to in the literature as the "contact angle inside the liquid"), D is the distance between the features of the patterned material layer (also called "space"), W is the width of the features of the patterned material layer (line width), and H is the height of the features of the patterned material layer (the parameters H and W determine the aspect ratio).

One approach to lower the maximum stress a for the cleaning and rinse step may include using a photoresist with modified polymers to make it more hydrophobic. However, this approach may decrease the wettability of the photoresist pattern by the rinse and cleaning solution which is not preferred.

In another approach to lower the maximum stress σ, the surface tension $\gamma$ of the fluid (both dynamic and equilibrium surface tension) has to be decreased. In order to decrease the surface tension of a fluid or a liquid surfactants are usually added to said fluid or liquid.

Still another approach to lower the maximum stress a would be to reduce the value of $\cos\theta$ by adjusting the value of the contact angle $\theta$ accordingly.

Another problem of the conventional photolithographic process is line edge roughness (LER) and line width roughness (LWR) due to resist and optical resolution limits. LER includes horizontal and vertical deviations from the feature's ideal form. In particular, as critical dimensions shrink the LER becomes more problematic and has negative effects, such as an increased transistor leakage current, thus lowering the performance of an integrated circuit (IC) device.

Due to the shrinkage of the dimensions, the removal of particles becomes a critical factor in order to achieve a defect reduction. The latter also applies to photoresist patterns as well as to other patterned material layers, which are generated during the manufacture of optical devices, micromachines and mechanical precision devices.

An additional problem of the conventional photolithographic process is the presence of watermark defects. Watermarks may form on the photoresist as the deionized water or defect rinse solution cannot be spun off from the hydrophobic surface of the photoresist. The watermarks have a harmful effect on yield and IC device performance.

Yet another problem is the occurrence of so called "Blob Defects". These defects are caused during UV exposure and/or photoresist development and have often the form of a round "crater-like" opening on one or more of the top layers on the photoresist, e.g. polymeric and photosensitive layers. Small particles or other insoluble matter can be trapped in those opening and result in inefficient particle removal or blocking of the openings. In particular, hydrophobic fragments or aggregates of hydrophobic molecules can be absorbed in or on those defect sides. These remaining particles, fragments or aggregates cause problems at later process stages.

Another problem of the conventional photolithographic process is the absorbance of solvents by the photoresist layer or the patterned material layer resulting in swelling of these layers. Patterns in very close proximity, in particular patterns having line-space structures with a line width of 50 nm or below, thus get into direct contact with each other after swelling. Furthermore, the swollen patterns in direct contact to each other will subsequently stick together even after developing, cleaning or rinsing of the product, in particular products according to the present invention. Photoresist swelling thus limits the minimum achievable line-space dimensions of a product, in particular for products defined in the present invention.

Herein and in the context of the present invention, the term "patterned material layer" refers to a layer supported on a substrate. The supported layer has a specific pattern preferably having line-space structures with a line width of 50 nm and below wherein the supporting substrate is typically a semiconductor substrate, e.g., a semiconductor wafer.

The term "patterned material layer having line-space structures with a line width of 50 nm or below" means that the patterned material comprises line space structures with a line width of 50 nm but also line space structures with a smaller (narrower) line width than 50 nm, in particular line space structures with a line width of 32 nm or below or line space structures with a line width of 22 nm or below. In the product comprising a substrate and supported thereon a patterned material layer having line-space structures with a line width of 50 nm and below (i.e. in the product which is subject to the method of making, use and/or treatment according to the present invention) the ratio of the line width to the width of space between two adjacent lines is preferably lower than 1:1, more preferably lower than 1:2. Patterned material layers having such a low "line-width-to-space-width" ratio are known by the skilled person to require a very delicate handling during production.

The line width of line-space structures of a patterned material layer can readily be determined by scanning electron microscopy, e.g. by scanning electron microscopy with a Hitachi CG 4000 scanning electron microscope.

Typically, a patterned material layer that is subject to the treatment according to the present invention is formed by deposition of a polymeric photoresist onto a support and subsequent exposure of the supported photoresist layer to actinic radiation through a mask. After developing the exposed photoresist layer with a developer solution a patterned material layer results. In some cases, a post-exposure bake (PEB) is conducted before developing with a developer solution. A typical developer solution is, e.g., an aqueous solution comprising TMAH (see e.g. WO 2014/091363, p. 23, l. 10).

Several exemplary publications of the prior art describe ionic or non-ionic surfactants and/or compositions for cleaning or rinsing a product:

Document WO 2010/149262 A1 (equivalent to US 2012/111233 A1) relates to fluorosurfactants.

Document WO 2012/084118 A1 relates to derivatives of perfluoroalkoxy sulfosuccinates as surface-active surfactants.

Document WO 2012/101545 A1 relates to the use of surfactants having at least three short-chain perfluorinated groups for manufacturing integrated circuits having patterns with line-space dimensions below 50 nm.

Document WO 2013/022673 A2 pertains to perfluoroalkyl sulfonamide surfactants for photoresist rinse solutions.

Document WO 2015/004596 A1 pertains to the use of surfactants having at least three short-chain perfluorinated groups in formulations for photo mask cleaning.

Document WO 2017/009068 A1 deals with a defect reduction rinse solution containing ammonium salts of sulfoesters.

Document GB 1 573 208 A discusses a surface-treating agent adapted for intermediate products of a semiconductor device.

Document JPS5064208 A pertains to the manufacture of fluorine compounds.

Documents JPS50101306 A and JPS50101307 A both relate to fluorine-containing compounds.

Document JPS5952520 A pertains to fluorine-containing surfactants which are prepared by reacting polyhydroxy compounds with perfluoroalkene trimer compounds.

In the light of the prior art there is still a need for compositions which are useful for improved cleaning or rinsing of a product used in the semiconductor industry comprising a substrate, e.g. a product with a patterned material layer supported thereon having line-space structures with a line width of 50 nm or below, and for a respective method of making such a product.

Correspondingly, it was a primary object of the present invention to provide a composition that can be used for improved cleaning or rinsing a product used in the semiconductor industry comprising a substrate, e.g. a product with a patterned material layer supported thereon having line-space structures with a line width of 50 nm or below. The use of said composition should allow for the prevention of pattern collapse, the reduction of line edge roughness, the prevention or reduction of water mark defects, the prevention or reduction of photoresist-swelling, the prevention or reduction of blob defects, and/or for particle removal and should ideally allow for an improved effect in one or more, preferably in all, of the aforementioned cleaning or rinsing results, when compared to known compositions from the prior art.

It was a further object of the present invention to provide a corresponding method of making a cleaned or rinsed product comprising a substrate and supported thereon a patterned material layer having line-space structures with a line width of 50 nm or below.

It has now been found that the primary object and other objects of the present invention are accomplished by a composition for cleaning or rinsing a product, preferably a product used in the semiconductor industry, comprising (A) as primary surfactant an ionic compound of formula (I),

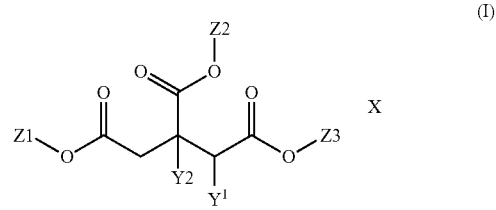

wherein

X is a cation, preferably a monovalent cation not comprising a metal, more preferably selected from the group consisting of
a proton,
and
a group $NR_4^+$, where each R is independently selected from the group consisting of H and a branched or unbranched (i.e. linear) $C_{1-6}$-alkyl group (i.e. an alkyl group having 1, 2, 3, 4, 5 or 6 carbon atoms);

one of Y1 and Y2 is an anionic polar group and the other is hydrogen, each group Z1, Z2 and Z3 is, independent of each other,
a branched or unbranched $C_{1-10}$-alkyl group (i.e. an alkyl group having 1, 2, 3, 4, 5, 6, 7, 8, 9 or 10 carbon atoms),
or (preferably)
a group of the structure $R^i\text{-}\{A[\text{-}C(R^1)(R^2)\text{---}]_c[\text{---}C(R^3)(R^4)\text{---}]_d\}_e$, wherein $R^1$, $R^2$, $R^3$ and $R^4$ are, independent of each other, hydrogen or a branched or unbranched $C_{1-4}$-alkyl group (i.e. an alkyl group having 1, 2, 3 or 4 carbon atoms),
$R^i$ is a branched or unbranched $C_{1-10}$-fluoroalkyl group (i.e. an alkyl group having 1, 2, 3, 4, 5, 6, 7, 8, 9 or 10 carbon atoms, wherein one or more hydrogen atoms are substituted by fluorine atoms), A is oxygen, sulfur and/or (preferably or) —N(H)—, more preferably oxygen (if more than one A is present, the meaning of each A is independent of the meaning of any other A), c is an integer in the range of from 0 to 10, d is an integer in the range of from 0 to 10, e is an integer in the range of from 1 to 5, with the proviso that c and d are not simultaneously 0 (i.e. c+d>0), and wherein at least one of the groups Z1, Z2 or Z3 is a group of the structure $R^i\text{-}\{A[\text{-}C(R^1)(R^2)\text{---}]_c[\text{---}C(R^3)(R^4)\text{---}]_d\}_e\text{---}$;

and (B) as secondary surfactant, at least one non-ionic compound comprising one or more polyalkyloxy and/or polyalkylenoxy groups.

The invention as well as preferred embodiments and preferred combinations of parameters, properties and elements thereof are defined in the appended claims. Preferred aspects, details, modifications and advantages of the present invention are also defined and explained in the following description and in the examples stated below.

It has been found that the composition according to the present invention shows excellent cleaning and/or rinsing results on a substrate with a patterned material layer supported thereon having line-space structures with a line width of 50 nm or below and at the same time shows excellent prevention of pattern collapse, reduction of line edge roughness, prevention or reduction of watermark defects, prevention or reduction of photoresist-swelling, prevention or reduction of blob defects and/or excellent particle removal. In particular, it has been found that cleaning or rinsing with a composition of the present invention reduces to a high extent and ideally prevents pattern collapse.

The prevention of pattern collapse, reduction of line edge roughness, prevention or reduction of water mark defects, prevention or reduction of photoresist-swelling, prevention or reduction of blob defects, and/or excellent particle removal is also collectively referred to as "defect reduction" in the present text.

The composition according to the present invention is therefore particularly suited as defect reduction rinse solution for a semiconductor substrate.

It is thus assumed that the combination of a primary ionic surfactant (A) comprising one or more fluoroalkyl groups and at least one secondary, non-ionic surfactant (B) comprising one or more polyalkyloxy and/or polyalkylenoxy groups according to the present invention provides synergetic effects for improved cleaning and defect reduction rinse results on a product used in the semiconductor industry, comprising a substrate and supported thereon a patterned material layer having line-space structures with a line width of 50 nm or below. Without wishing to be bound by theory it is presently assumed that the primary ionic surfactant (A) provides to the composition reduced surface tension, fast dynamic surface tension, good wettability, in particular good wettability of a patterned material layer having line-space structures with a line width of 50 nm or below, and excellent defect reduction. On the other hand, it is presently assumed that the secondary, non-ionic surfactant (B) favorably mediates the extent of interaction between the primary ionic surfactant (A) and the patterned material layer having line-space structures with a line width of 50 nm or below, in particular a photo resist, that it improves the solubility and/or the colloidal stability of the primary ionic surfactant (A) in the carrier solvent (usually water), that it minimizes adhesion of particles on the surface of the patterned material layer and/or that it reduces re-deposition of such particles on said surface.

Moreover, it is currently assumed that the compositions of the present invention reduce two factors impacting the maximum stress σ caused by the capillary forces between small features of e.g. photoresists, i.e., features having a high aspect ratio, on a semiconductor substrate (see above), i.e. the equilibrium surface tension of the fluid γ, and cos θ of the contact angle θ of the fluid on the substrate (i.e. the contact angle of the fluid with the structures of e.g. the photoresist, see above) having supported thereon the patterned material layer, which makes them particularly effective in reducing or avoiding the phenomenon of pattern collapse.

It has further been found that the secondary surfactants of non-ionic structure as used in the composition of the invention have the advantage that only few (if any) undesired particles are formed in the composition and that crystal formation in the composition is reduced or avoided. Particles or crystals formed in the composition would have the effect that cleaning or rinsing of e.g. a substrate with a patterned material layer supported thereon having line-space structures with a line width of 50 nm or below would be negatively affected as particles and/or crystals from the composition could deposit on said line space structures.

It has still further been found that non-ionic secondary surfactants comprising one or more polyalkyloxy and/or polyalkylenoxy groups are particularly well suited for interacting with a patterned material layer having line-space structures with a line width of 50 nm or below, in particular a photo resist, for the purposes of cleaning, rinsing or defect reduction. It has also been found that the structure and the length of the polyalkyloxy and/or polyalkylenoxy groups as defined herein (preferably a length in the range of from 1 to 100, more preferably in the range of from 1 to 50 and still more preferably in the range of from 5 to 30 alkylenoxy repeating units) has a beneficial effect for the inventive use of the compositions.

Another advantage of the present invention is that the primary surfactants of formula (I) in compositions of the present invention show improved environmental safety as they are assumed not to undergo degradation to long-chain perfluoroalkyl carboxylic acids and/or to perfluoroalkyl sulfonic acids with a bioaccumulation potential, thus allowing to manufacture compositions for cleaning or rinsing a product with at least reduced content of potentially environmentally harmful perfluoroalkyl surfactants.

According to the present invention, in the compound of formula (I), each group $R^i\text{-}\{A[\text{---}C(R^1)(R^2)]_c[\text{---}C(R^3)(R^4)\text{---}]_d\}_e\text{---}$ is preferably bonded to the oxygen atom of a carboxyl group of the compound of formula (I) via its right end (via the carbon atom of the or the last group $[\text{---}C(R^1)(R^2)\text{---}]$ or $[\text{---}C(R^3)(R^4)\text{---}]$, as applicable) as indicated by the bonding line next to the index "e".

According to the present invention, in the compound of formula (I), preferably, each group Z1, Z2 and Z3 is, independent of each other, a group of the structure $R^i\text{-}\{A[\text{-}C(R^1)(R^2)\text{---}]_c[\text{---}C(R^3)(R^4)\text{---}]_d\}_e\text{---}$. Where each group Z1, Z2 and Z3 is, independent of each other, a group of the structure $R^i\text{-}\{A[\text{-}C(R^1)(R^2)\text{---}]_c[\text{---}C(R^3)(R^4)\text{---}]_d\}_e\text{---}$, the groups Z1, Z2 and Z3 can be equal or they can be different from each other. In a preferred variant of the present invention, the groups Z1, Z2 and Z3 have equal structures "$R^i\text{-}\{A[\text{-}C(R^1)(R^2)\text{---}]_c[\text{---}C(R^3)(R^4)\text{---}]_d\}_e\text{---}$".

According to the present invention, in the compound of formula (I) (or in a preferred compound of formula (I) as defined herein), the branched or unbranched $C_{1-10}$-fluoroalkyl group $R^i$ preferably comprises a total number of 2 to 15, more preferably a total number of 3 to 10, fluorine atoms and/or is preferably unbranched (linear). More preferred and more specific definitions of this group are further defined below.

In the compound of formula (I), X is preferably a monovalent cation not comprising a metal, more preferably selected from the group consisting of a proton and a group $NR_4^+$, where each R is independently selected from the group consisting of H and a branched or unbranched $C_{1-6}$-alkyl group, preferably a branched or unbranched $C_{1-4}$-alkyl group. More preferably, X is a proton or ammonium ($NH_4+$).

In the compound of formula (I), the anionic polar group Y1 and/or Y2 is preferably selected from the group consisting of $COO^-$, $-SO3^-$, $-(O)SO_3^-$, $-PO_3^{2-}$ and $-(O)PO_3^{2-}$. Particularly preferably, the anionic polar group Y1 and/or Y2 is sulfonate ($-SO3^-$). In a particularly preferred variant of a compound of formula (I), Y1 is sulfonate and Y2 is hydrogen.

In the composition according to the present invention, the polyalkyloxy and/or polyalkylenoxy groups in the at least one non-ionic compound (B) preferably comprise at least 5 alkyloxy and/or alkylenoxy groups, respectively.

Compounds of formula (I) per se and their preparation are known e.g. from document WO 2010/149262 A1.

Preferred is a composition according to the invention, comprising (A) as primary surfactant an ionic compound of formula (I) (or a preferred compound of formula (I), as defined above)
and
(B) as secondary surfactant at least one non-ionic compound comprising one or more polyalkyloxy and/or polyalkylenoxy groups, selected from the group consisting of:
(B1) a compound of formula (II)

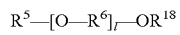

$$R^5-[O-R^6]_l-OR^{18} \quad (II)$$

wherein
$R^5$ is a branched or unbranched, preferably a branched, $C_{6-12}$-fluoroalkyl group or a branched or unbranched, preferably a branched, $C_{6-12}$-fluoroalkenyl group which preferably contains 1 or 2 double bonds,
and which preferably contains a total number of 12 to 20 fluorine atoms;
$R^6$ is a branched or unbranched $C_{2-6}$-alkylen group, preferably a branched or unbranched $C_{2-4}$-alkylen group, more preferably an unbranched $C_{2-3}$-alkylen group,
$R^{18}$ is hydrogen or a branched or unbranched $C_{1-4}$-alkyl group, preferably methyl,
and
l is an integer in the range of from 5 to 30, preferably in the range of from 6 to 25;
(B2) a compound of formula (III), $$H_3C-(CH_2)_m-CH_2-[O-R^7]_n-OR^{19} \quad (III)$$

wherein
$R^7$ is a branched or unbranched $C_{2-6}$-alkylen group, preferably a branched or unbranched $C_{2-4}$-alkylen group, more preferably an unbranched $C_{2-3}$-alkylen group,
$R^{19}$ is hydrogen or a branched or unbranched $C_{1-4}$-alkyl group, preferably methyl, m is an integer in the range of from 5 to 30, preferably in the range of from 6 to 25;
and
n is an integer in the range of from 5 to 30, preferably in the range of from 6 to 25;
(B3) a compound of formula (IV),

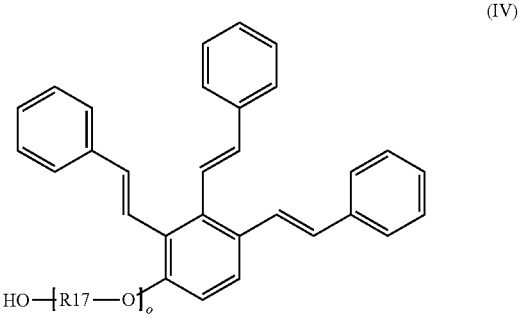

wherein
$R^{17}$ is a branched or unbranched $C_{2-6}$-alkylen group, preferably a branched or unbranched $C_{2-4}$-alkylen group, more preferably an unbranched $C_{2-3}$-alkylen group,
and
is an integer in the range of from 5 to 30, preferably in the range of from 6 to 25;
(B4) a compound of formula (V),

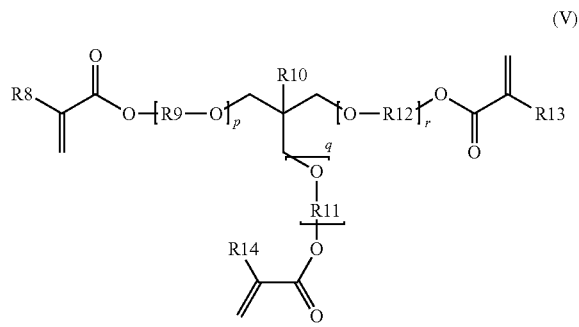

wherein
$R^8$, $R^3$ and $R^4$ are each independent of each other hydrogen or methyl, preferably $R^8$, $R^3$ and $R^4$ are all hydrogen,
$R^9$, $R^1$ and $R^2$ are each independent of each other a branched or unbranched $C_{2-6}$-alkylen group, preferably a branched or unbranched $C_{2-4}$-alkylen group, more preferably an unbranched $C_{2-3}$-alkylen group,
$R^{10}$ is a branched or unbranched $C_{1-4}$-alkyl group, preferably ethyl,
and
p, q and r are each independent of each other an integer in the range of from 2 to 25,
and
(B5) a compound of formula (VI), $$(H_3C)_3Si-O-R^{15}-O-Si(CH_3)_3 \quad (VI)$$

wherein

R$^{15}$ consists of a number in the range of from 1 to 100, preferably in the range of from 1 to 50, repeating units of formula (VII):

—[Si(CH$_3$)$_2$—O]— (VII), and a number in the range of from 1 to 100, preferably in the range of from 1 to 50, repeating units of formula (VIII):

—[Si(CH$_3$)(R$^{16}$)—O]— (VIII), wherein R$^{16}$ is a group comprising one or more ethylene glycol (i.e. 1,2-ethylenedioxy) groups and/or one or more propylene glycol (i.e. 1,3-propylenedioxy) groups, and wherein the repeating units of formula (VII) and the repeating units of formula (VIII) are arranged randomly or in random alternating blocks comprising in each case two or more repeating units of formula (VII) or of formula (VIII) per block.

In the composition of the present invention, one or more ionic compounds of formula (I) can be combined (e.g. mixed) with one or more non-ionic compounds of formula (II), (III), (IV), (V) and/or (VI). Preferred are compositions of the invention wherein only one type of ionic compound (I) is combined with one type of non-ionic compound, i.e. with a compound of formula (II) or with a compound of formula (III) or with a compound of formula (IV) or with a compound of formula (V) or with a compound of formula (VI).

The compounds of formula (II), (III), (IV), (V) and (VI) and ways for manufacturing them are known in the art and respective compounds are commercially available, e.g. as surfactants. Compounds of formula (II) and methods for synthesizing said compounds are known, e.g., from documents JPS5064208 A, JPS50101306 A, JPS50101307 A and JPS5952520. One preferred compound of formula IV is polyethylene glycol mono(tristyrylphenyl) ether (CAS® RN 99734-09-5). One preferred compound of formula (V) is ethoxylated trimethylolpropane triacrylate (CAS® RN 28961-43-5).

In the compounds of formula (VI), where more than one ethylene glycol group is present in R$^{16}$, these are preferably linked together and form a polyethylene glycol group. Where more than one propylene glycol group is present in R$^{16}$, these are preferably linked together and form a polypropylene glycol group. Compounds of formula (VI) are commercially available, e.g. as side-chain polyether-modified silicones by company Shin Etsu (JP). A preferred compound of formula V is marketed under the name "KF351A" by Shin Etsu. The compound "KF351" comprises as substituent R$^{16}$ polyalkylenoxy groups of formula (IX):

R$^a$—(C$_2$H$_4$O)$_s$(C$_3$H$_6$O)$_t$R$^b$ (IX)

The compound KF351 further has a kinematic viscosity in the range of from 65 to 75 mm$^2$/s at 25° C., preferably as measured according to DIN 53015:2001-02 using the Hoeppler Falling-Ball Viscometer. The compound KF351 is further characterized by a specific gravity at 25° C. (in relation to water) in the range of from 1.0 to 1.10, preferably of 1.06. The compound KF 351 is still further characterized by a hydrophilic-lipophilic balance ("HLB") value in the range of from 10 to 20, preferably in the range of from 10 to 15, more preferably of 12, determined according to the method of Griffin (see Griffin, W. C.: "Classification of surface active agents by HLB", J. Soc. Cosmet. Chem. 1, 1949).

A composition according to the invention as defined herein (or a composition according to the invention as described above or below as being preferred) is preferred, comprising (A) as primary surfactant an ionic compound of formula (I) as defined above, wherein each group Z1, Z2 and Z3 is independent of each other a group of the structure R$^i${A[-C(R$^1$)(R$^2$)]$_c$[—C(R$^3$)(R$^4$)—]$_d$}$_e$—, wherein R$^i$, A, R$^1$, R$^2$, R$^3$, R$^4$, c, d and e have the meanings or preferred meanings as defined above, and/or (preferably and)

(B) as secondary surfactant at least one non-ionic compound of formula (II) as defined above.

It has been found in own experiments that a composition according to the invention comprising as primary surfactant an ionic compound of formula (I) and as secondary surfactant at least one non-ionic compound of formula (II) as defined above (or at least one preferred non-ionic compound of formula (II) as defined herein) have particularly beneficial properties in cleaning or rinsing a product, in particular a product comprising a substrate, more in particular a semiconductor substrate, and supported thereon a patterned material having line-space structures with a line width of 50 nm or below, and have particularly beneficial properties in defect reduction on said product. It has also been found in own experiments that a composition according to the invention comprising as primary surfactant an ionic compound of formula (I) and as secondary surfactant at least one non-ionic compound of formula (II) as defined above (or at least one preferred non-ionic compound of formula (II) as defined herein) show particularly good storage stability (shelf life) for extended periods of time, e.g. for a period of 6 months or longer, preferably for a period of 12 months or longer.

A composition according to the invention as defined herein (or a composition according to the invention as described above or below as being preferred) is preferred, wherein in the compound of formula (I), each group Z1, Z2 and Z3 is independent of each other an alkyl-fluoroalkylether group, which preferably has a total number of from 4 to 50, more preferably of from 5 to 20, yet more preferably of from 6 to 10 carbon atoms and has a total number of from 2 to 15, more preferably of from 3 to 10, fluorine atoms and/or preferably is bonded to the adjacent oxygen atom of the carboxyl group or groups of the compound of formula I via its alkyl group.

One preferred example of such compound of formula (I) as defined here above is a compound of formula (Ia) (see below), where the alkyl-fluoroalkylether group has the structure F$_3$C—CF$_2$—CH$_2$—O—CH$_2$—CH(C$_2$H$_5$)—.

A composition according to the invention as defined herein (or a composition according to the invention as described above or below as being preferred) is preferred, wherein in the compound of formula (I), X is a monovalent cation not comprising a metal, preferably selected from the group consisting of
a proton
and
a group $NR_4^+$, where each R is independently selected from the group consisting of H and a branched or unbranched $C_{1-6}$-alkyl group, preferably a branched or unbranched $C_{1-4}$-alkyl group;

one of Y1 and Y2 is an anionic polar group selected from the group consisting of —COO—, —$SO_3$, —(O)$SO_3$, —$PO_3^{2-}$ and —(O)$PO_3^{2-}$, preferably sulfonate —$SO_3$, and the other is hydrogen, preferably Y1 is the anionic polar group and Y2 is hydrogen,
and
each group Z1, Z2 and Z3 is, independent of each other, a group of the structure $R^i\text{-}\{A[\text{-}C(R^1)(R^2)\text{—}]_c[\text{—}C(R^3)(R^4)\text{—}]_d\}_e\text{—}$, wherein:
$R^1$, $R^2$, $R^3$ and $R^4$ are, independent of each other, hydrogen or a branched or unbranched $C_{1-4}$-alkyl group,
$R^i$ is a branched or unbranched $C_{1-10}$-fluoroalkyl group,
c is an integer in the range of from 1 to 10,
d is an integer in the range of from 1 to 10,
and
e is an integer in the range of from 1 to 5.

Furthermore, a composition according to the invention as defined herein (or a composition according to the invention as described above or below as being preferred) is preferred, wherein in the compound of formula (I),
X is selected from the group consisting of
a proton
and
a group $NR_4^+$, where each R is independently selected from the group consisting of H and a branched or unbranched $C_{1-6}$-alkyl group, preferably a branched or unbranched $C_{1-4}$-alkyl group; more preferably the group $NR_4^+$ is $NH_4^+$ one of Y1 and Y2 is sulfonate —$SO_3$, and the other is hydrogen, preferably Y1 is sulfonate and Y2 is hydrogen,
each group Z1, Z2 and Z3 is, independent of each other, a group of the structure $F_3C(CF_2)_a(CH_2)b\{\text{—}O[\text{—}C(R^1)(R^2)\text{—}]_c[\text{—}C(R^3)(R^4)\text{—}]_d\}_e\text{—}$, wherein:
$R^1$, $R^2$, $R^3$ and $R^4$ are, independent of each other, hydrogen or a branched or unbranched $C_{1-4}$-alkyl group, preferably a $C_{1-2}$-alkyl group,
a is an integer in the range of from 0 to 2, preferably a is 1 or 2,
b is an integer in the range of from 1 to 6, preferably b is 1 or 2,
c is an integer in the range of from 1 to 10, preferably c is 1 or 2,
d is an integer in the range of from 1 to 10, preferably d is 1 or 2, and
e is an integer in the range of from 1 to 5, preferably e is 1,
and wherein preferably all groups Z1, Z2 and Z3 have the same structure.

Furthermore, a composition according to the invention as defined herein (or a composition according to the invention as described above or below as being preferred) is particularly preferred, wherein in the compound of formula (I):

X is selected from the group consisting of
a proton
and
a group $NR_4^+$, where each R is independently selected from the group consisting of H and a branched or unbranched $C_{1-6}$-alkyl group, preferably a branched or unbranched $C_{1-4}$-alkyl group; more preferably the group $NR_4^+$ is $NH_4+$;
Y1 is sulfonate, —$SO_3$,
Y2 is hydrogen
and the groups Z1, Z2 and Z3 have the same structure and are in each case a group of the formula $F_3C\text{—}CF_2\text{—}CH_2\text{—}O\text{—}CH_2\text{—}CH(C_2H_5)\text{—}$.

A composition according to the invention as defined herein (or a composition according to the invention as described above or below as being preferred) is thus also particularly preferred, wherein the compound of formula (I) is a compound of formula (Ia):

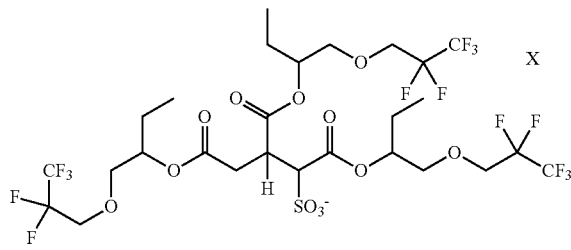

(Ia)

wherein X is selected from the group consisting of a proton and a group $NR_4^+$, where each R is independently selected from the group consisting of H and a branched or unbranched $C_{1-6}$-alkyl group, preferably a branched or unbranched $C_{1-4}$-alkyl group; more preferably the group $NR_4^+$ is $NH_4+$.

Moreover, a composition according to the invention as defined herein (or a composition according to the invention as described above or below as being preferred) is preferred, wherein the compound of formula (II) is selected from the group consisting of
a compound of formula (IIa):

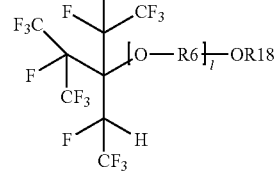

(IIa)

wherein
$R^6$, $R^{18}$ and I have the above meanings or preferred meanings (as defined above for formula (II)),
a compound of formula (IIb):

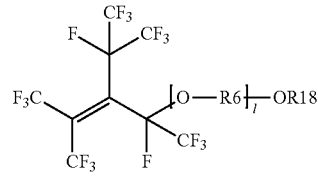

(IIb)

wherein

R$^6$, R$^{18}$ and I have the above meanings or preferred meanings (as defined above for formula (II))

and mixtures thereof.

Particularly preferred is a composition according to the invention comprising as primary surfactant (A) a compound of formula (I), preferably a preferred compound of formula (I) as defined above, and as secondary surfactant (B) one or more (preferably one) compounds of formula (IIa) and/or one or more (preferably one) compounds of formula (IIb).

One preferred compound of formula (II) is a reaction product of a polyethylene glycol ether with the compound 1,1,1,2,4,5,5,5-Octafluoro-3-(1,1,1,2,3,3,3-heptafluoro-2-propanyl)-4-(trifluoromethyl)-2-pentene (see for example JPS5064208 A, JPS50101306 A, JPS50101307 A and/or JPS5952520) which is commercially available as FTergent®212M by company Neos (JP).

Since an aqueous composition is preferred for an intended use as e.g. defect reduction rinse solution for a semiconductor substrate, a composition according to the invention as defined herein (or a composition according to the invention as described above or below as being preferred) is preferred, comprising as further component:

(C) water, preferably deionized water.

As mentioned above, it has also been found in own experiments that the secondary, non-ionic surfactant (B) according to the invention, in particular the non-ionic compound of formula (II) (including the particularly preferred compounds of formula (IIa) and (IIb)), beneficially mediates the extent of interaction between the primary (ionic) surfactant (A) and the patterned material layer having line-space structures with a line width of 50 nm or below, in particular a photo resist, that it improves the solubility and/or the colloidal stability of the primary ionic surfactant (A) in water as carrier solvent and minimizes adhesion of particles on the surface of the patterned material layer and/or reduces re-deposition of such particles on said surface.

A composition according to the invention as defined herein (or a composition according to the invention as described above or below as being preferred), preferably a composition comprising as secondary surfactant at least one non-ionic compound of formula (II), is also preferred wherein:

the mass ratio of the compound of formula (I) to the compound of formula (II) (including, where present, a compound of formula (IIa) and/or a compound of formula (IIb)) present in the composition is in the range of from 1:4 to 1:1, preferably in the range of from 1:3 to 3:4, and/or the sum of the total amount of compound of formula (I) and the total amount of compound of formula (II)

present in the composition is in the range of from 0.01 wt.-% to 0.5 wt.-%, preferably in the range of from 0.02 wt.-% to 0.25 wt.-%, more preferably in the range of from 0.05 wt.-% to 0.12 wt.-%, based on the total weight of the composition.

It has been found in own experiments that a composition according to the invention having the preferred mass ratios of a compound of formula (I) to a compound of formula (II) (preferably of a compound of formula (IIa)) present in the composition as defined above have particularly beneficial properties in cleaning or rinsing a product, in particular a product comprising a substrate, more in particular a semiconductor substrate, and supported thereon a patterned material having line-space structures with a line width of 50 nm or below, and have particularly beneficial properties in defect reduction on said product.

It has also been found in own experiments that a composition according to the present invention having the preferred mass ratios and total amounts (concentrations), as defined above, of a compound of formula (I) and a compound of formula (II) (preferably of a compound of formula (IIa) and/or of formula (IIb)) present in the composition show a preferred balance on a substrate, e.g. a semiconductor substrate, which has supported thereon a patterned material having line-space structures with a line width of 50 nm or below, of a sufficient wettability and of a sufficiently low surface tension on the one hand and a sufficiently low, if any, micelle formation in the composition and/or residue formation on the substrate, on the other hand. Micelle formation in the composition and/or residue formation on the substrate would negatively impact the structures of the patterned material and subsequently the functionality of the resulting product.

A composition according to the invention as defined herein (or a composition according to the invention as described above or below as being preferred), preferably an aqueous composition, preferably comprising as secondary surfactant at least one non-ionic surfactant of formula (II), is also preferred wherein:

the equilibrium surface tension of the composition is less than 35 mN/m, preferably less than 30 mN/m, more preferably is less than 28 mN/m and even more preferably is less than 25 mN/m, preferably as measured at 25° C. according to the norm DIN 53914:1997-07 with a Kruess Tensiometer K 100 by the plate method, and/or the pH of the composition is in the range of from 4.0 to 11.0, preferably in the range of from 7.0 to 11.0, more preferably in the range of from 8.0 to 10.0 and even more preferably in the range of from 8.0 to 9.6.

It has been found in own experiments that an aqueous composition of the invention, in particular an aqueous composition comprising a compound of formula (I), preferably a preferred compound of formula (I) as defined above, and one or more (preferably one) compounds of formula (IIa) and/or of formula (IIb), are particularly stable in an alkaline environment, e.g. in an environment of a pH in the range of from 9 to 12 or of a pH in the range of from 9.5 to 11. Stability of the compositions of the invention in an alkaline environment as explained above is advantageous as particles (from processes usually conducted in the field) can often best be removed from a substrate which has supported on it a patterned material having line-space structures with a line width of 50 nm or below in alkaline media. Common methods of cleaning or rinsing a product comprising a substrate, preferably a semiconductor substrate, are thus usually carried out with alkaline media, e.g. because in an alkaline environment the zeta potentials or the charges of the particles to be removed support repulsion effects which facilitate removal of the particles.

It has also been found that compositions of the invention with a pH in the range of from 8.0 to 10.0, preferably in the range of from 8.0 to 9.6 are particularly stable over extended time periods and are therefore most suited under the aspect of optimized storage stability.

The pH of the compositions according to the invention can be adjusted by methods known in the field, e.g. by adding suitable amounts of weak acids or bases, preferably with low content of metal ions, preferably free of metal ions.

One preferred base for adjusting the pH of the compositions according to the invention is ammonium hydroxide.

A composition according to the invention as defined herein (or a composition according to the invention as described above or below as being preferred) is also preferred, comprising or consisting of:
- (A) as primary surfactant an ionic compound of formula (I) (as defined above, or a preferred compound of formula (I) as defined above),
- (B) as secondary surfactant at least one non-ionic compound comprising one or more polyalkyloxy and/or polyalkylenoxy groups (as defined above, or a preferred non-ionic compound comprising one or more polyalkyloxy and/or polyalkylenoxy groups as defined above), preferably at least one compound of formula (II) (as defined above),
- (C) water (as defined above)
and
- (D) one or more solubilizers, preferably one or more partial ethers (i.e. at least one hydroxyl group of such partial ether is a free hydroxyl group) of alkylen glycols (alkandiols) comprising a total number of 3 to 6 carbon atoms, with alkyl groups comprising a total number of 1 to 4 carbon atoms, more preferably one or more partial ethers of ethylenglycol or of propylene glycols, in each case with an alkyl group comprising a total number of 1 to 4 carbon atoms, yet more preferably the solubilizer is or comprises 1-methoxy-2-propanol.

In preferred compositions of the invention, preferably as described here above, the sum of the
- total amount of compound of formula (I) (component (A)) and
- the total amount of the at least one non-ionic compound comprising one or more polyalkyloxy and/or polyalkylenoxy groups, preferably at least one compound of formula (II) (component (B))
- present in the composition is in the range of from 0.01 wt.-% to 0.5 wt.-%, preferably in the range of from 0.02 wt.-% to 0.25 wt.-%, more preferably in the range of from 0.05 wt. % to 0.1 wt.-%, based on the total weight of the composition
and
- the total amount of the one or more solubilizers (component (D)) present in the composition is in the range of from 0.01 wt.-% to 0.5 wt.-%, preferably in the range of from 0.02 wt.-% to 0.25 wt.-%, more preferably in the range of from 0.05 wt.-% to 0.1 wt.-%, based on the total weight of the composition.

A composition according to the invention as defined herein (or a composition according to the invention as described above or below as being preferred) is also preferred wherein
- the total amount of constituents (A), (B), (C) and (D), preferably the total amount of constituents (A), (B), and (C), is above 90 wt.-%, preferably above 95 wt.-% and even more preferably above 98 wt.-%, based on the total weight of the composition
and/or
- the pH of the composition is in the range of from 7.0 to 11.0, preferably in the range of from 8.0 to 10.0 and more preferably in the range of from 8.0 to 9.6.

Apart from components (A) to (D) listed above, preferred compositions of the invention preferably only comprise weak acids or bases, in amounts as necessary for adjusting pH values of the compositions to the values or preferred values as defined herein.

For measuring the equilibrium surface tension according to the norm DIN 53914:1997-07 by the plate method (see above) a thin plate is used, usually in the order of a few square centimeters in area. The plate is usually made from platinum having a high surface energy to ensure complete wetting. The force F on the plate due to wetting is measured via a tensiometer (or microbalance) and used to calculate the equilibrium surface tension γ using the Wilhelmy equation:

$$\gamma = \frac{F}{l \cdot \cos(\theta)}$$

where $l$ is the wetted perimeter of the Wilhelmy plate and $\theta$ is the equilibrium contact angle between the liquid phase and the plate. This equilibrium contact angle is different from the contact angle used for calculating the maximum stress σ between small features (e.g. of a photoresist) caused by capillary forces (see above).

The contact angle is generally the angle, conventionally measured through the liquid, where a liquid-vapour interface meets a solid surface. It quantifies the wettability of a solid surface by a liquid via the Young equation which is generally known in the field. A given system of solid, liquid, and vapor at a given temperature and pressure has a unique equilibrium contact angle. The equilibrium contact angle reflects the relative strength of the liquid, solid, and vapor molecular interaction.

It has also been found in own experiments that a composition according to the invention having the preferred equilibrium surface tension as defined above shows a beneficial spreading ability which indicates good and fast cleaning or rinsing action on a product. A "good spreading ability" is preferably characterized by a low equilibrium contact angle on a product, in particular a product comprising a substrate, more in particular a semiconductor substrate, and supported thereon a patterned material having line-space structures with a line width of 50 nm or below (e.g. on a photoresist supported on a semiconductor wafer), i.e. an equilibrium contact angle in the range of from 0° to 25°, preferably in the range of from 0° to 20°, preferably determined according as defined in the norm DIN 53914:1997-07. The skilled person can adjust the equilibrium surface tension according to known methods in the field.

The lower the equilibrium surface tension of the composition the lower the capillary forces to prevent or reduce pattern collapse (e.g. according to Namatsu et al. Appl. Phys. Let. 66(20), 1995 see above). An additional advantage of the compositions according to the invention having a specific equilibrium surface tension and/or their use is that penetration and cleaning of patterned material layer having line-space structures (pattern) in nm-scale is very efficient.

A composition according to the invention as defined herein (or a composition according to the invention as described above or below as being preferred) is particularly preferred, comprising
- (A) as primary surfactant an ionic compound of formula (I),
  wherein
  X is selected from the group consisting of a proton and a group $NR_4^+$, where each R is independently selected from the group consisting of H and a branched or unbranched $C_{1-6}$-alkyl group, preferably a branched or unbranched $C_{1-4}$-alkyl group; more preferably the group $NR_4^+$ is $NH_4^+$, Y1 is sulfonate, —SO$_3$,
Y2 is hydrogen
and
the groups Z1, Z2 and Z3 have the same structure and are in each case a group of the formula F$_3$C—CF$_2$—CH$_2$—O—CH$_2$—CH(C$_2$H$_5$)—,
and
(B) as secondary surfactant, at least one non-ionic compound of formula (IIa),

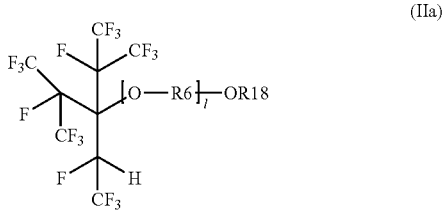

(IIa)

wherein
R$^6$ is a branched or unbranched C$_{2-4}$-alkylen group, preferably an unbranched C$_{2-3}$-alkylen group,
R$^{18}$ is hydrogen or a branched or unbranched C$_{1-4}$-alkyl group, preferably methyl,
and
I is an integer in the range of from 5 to 30, preferably in the range of from 6 to and/or (i.e. including mixtures of the at least one compound of formula (IIa) and the at least one compound of formula (IIb))
at least one compound of formula (IIb):

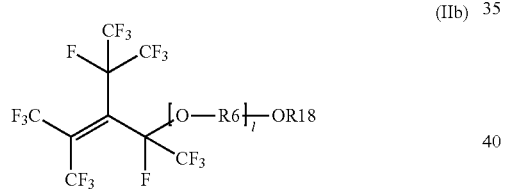

(IIb)

wherein
R$^6$ is a branched or unbranched C$_{2-4}$-alkylen group, preferably an unbranched C$_{2-3}$-alkylen group,
R$^{18}$ is hydrogen or a branched or unbranched C$_{1-4}$-alkyl group, preferably methyl, and
I is an integer in the range of from 5 to 30, preferably in the range of from 6 to
and
(C) water,
wherein the pH of the composition is in the range of from 7.0 to 11.0, preferably in the range of from 8.0 to 10.0 and more preferably in the range of from 8.0 to 9.6,
and wherein preferably
the sum of
the total amount of compound of formula (I) and
the total amount of compound of formula (II)
present in the composition is in the range of from 0.01 wt.-% to 0.5 wt.-%, preferably in the range of from 0.02 wt.-% to 0.25 wt.-%, more preferably in the range of from 0.05 wt.-% to 0.1 wt.-%, based on the total weight of the composition.

The present invention also relates to a use of a composition according to the invention as defined herein (or to the use of a composition according to the invention as described herein as being preferred), for cleaning or rinsing a product, preferably a product comprising a substrate and supported thereon a patterned material having line-space structures with a line width of 50 nm or below, so that preferably
pattern collapse is prevented or reduced,
line edge roughness is reduced,
watermark defects are prevented or removed,
photoresist-swelling is prevented or reduced,
blob defects are prevented or reduced
and/or
particles are removed.

Generally, all aspects of the present invention discussed herein in the context of the inventive composition for cleaning or rinsing a product apply mutatis mutandis to the use of said cleaning composition according to the invention, as defined here above and below, and vice versa.

The product which is cleaned or rinsed according to the use of the invention is preferably a product used in the semiconductor industry.

The presence of the before mentioned flaws or effects would have a negative impact on the performance of the resulting product, in particular for devices as integrated circuit devices, optical devices, micromachines, or mechanical precision devices, and correspondingly the present invention (which helps to avoid these flaws or effects) is of high industrial value.

A use of a composition according to the invention as defined herein (or a use according to the invention as described herein as being preferred), is therefore preferred wherein
said cleaning or rinsing is part of a process of making integrated circuit devices, optical devices, micromachines, or mechanical precision devices, and/or
said substrate is a semiconductor substrate, preferably a semiconductor wafer.

A use of a composition according to the invention as defined herein (or a use according to the invention as described herein as being preferred), is also preferred wherein
the patterned material layer having line-space structures with a line width of 50 nm or below is selected from the group consisting of patterned developed photoresist layers, patterned barrier material layers, patterned multi-stack material layers, and patterned dielectric material layers,
and/or
the patterned material layer has aspect ratios of greater than 2, preferably of greater than 3, for photoresist structures and/or for patterned multi-stack line/space structures,
and/or
the patterned material has line-space structures with a line width of 32 nm or below, preferably of 22 nm or below.

Patterned developed photoresist layers, patterned barrier material layers, patterned multi-stack material layers, and patterned dielectric material layers are particularly prone to pattern collapse, low line edge roughness and photoresist-swelling. Avoiding these negative effects improves device performance as well as production output as the number of malfunctioning devices produced is considerably reduced.

Preferred is the use according to the present invention of a composition as defined above (or as defined above as being preferred), wherein the patterned material layer has aspect ratios of greater than 10 for non-photoresist structures and aspects ratios of greater than 2, preferably of greater than 3, for photoresist structures. Material layers having aspect ratios of greater than 10 for non-photoresist structures and aspects ratios of greater than 2, preferably of greater than 3, for photoresist structures are particularly prone to pattern collapse during cleaning or rinsing and thus are preferably cleaned and rinsed with compositions as defined above, preferably with compositions as defined above having an equilibrium surface tension of less than 35 mN/m, preferably of less than 30 mN/m, more preferably of less than 28 mN/m, even more preferably of less than 25 mN/m, preferably determined at the critical micelle concentration. The advantage of such compositions is that pattern collapse is particularly efficiently reduced or avoided.

Particularly, the use according to the present invention of a composition as defined above (or as defined above as being preferred) is preferred, wherein the patterned material layer has line-space structures with a line width of 32 nm or below, preferably of 22 nm or below. Patterned material layers with line-space structures with a line width of 32 nm or below, preferably of 22 nm or below, are particularly prone to pattern collapse during cleaning or rinsing, and thus are preferably cleaned and rinsed with compositions as defined above, more preferably with compositions as defined above having an equilibrium surface tension of less than 35 mN/m, preferably of less than 30 mN/m, more preferably of less than 28 mN/m, even more preferably of less than 25 mN/m, preferably determined at the critical micelle concentration.

The present invention also relates to a method of making a cleaned or rinsed product comprising a substrate and supported thereon a patterned material layer having line-space structures with a line width of 50 nm or below, the method comprising the following steps:
  preparing or providing a product comprising a substrate and supported thereon a patterned material layer having line-space structures with a line width of 50 nm or below,
  preparing or providing a composition according to the invention as defined above (or a composition according to the invention as defined above as being preferred), and
    cleaning or rinsing said product with said composition so that the cleaned or rinsed product results.

Generally, all aspects of the present invention discussed herein in the context of the inventive composition for cleaning or rinsing a product and/or for the inventive use of said composition apply mutatis mutandis to the method of making a cleaned or rinsed product according to the invention as defined herein, and vice versa.

Preferred is a method according to the invention as defined herein, further comprising the following steps:
  providing a substrate with an immersion photoresist layer, an EUV photoresist layer or an electron beam photoresist layer,
  exposing the photoresist layer to actinic radiation through a mask with or without an immersion liquid,
  developing the exposed photoresist layer with a developer solution to obtain a pattern having line-space structures with a line width of 50 nm or below, so that the product results comprising a substrate and supported thereon a patterned material layer having line-space structures with a line width of 50 nm or below,
  cleaning or rinsing said product with said composition so that the cleaned or rinsed product results,
  and optionally
    drying said cleaned or rinsed product, preferably by spin drying or by a drying process.

EXAMPLES

The following examples are meant to further explain and illustrate the present invention without limiting its scope.

Example 1: Preparation of Test Compositions

The following compositions I1, I1a and I2, according to the invention and compositions C1 and C2 as comparative compositions not according to the invention, (collectively referred to as the "test compositions" hereinafter) were prepared by conventional mixing of the components shown in table 1a. After mixing, the pH of the composition was adjusted by addition of a diluted aqueous ammonia solution, as required. In the compositions shown in tables 1a and 1b, the compound of formula (I) used therein is a compound of formula (I) wherein X is $NH_4^+$, Y1 is sulfonate, $-SO_3$, Y2 is hydrogen and the groups Z1, Z2 and Z3 have the same structure and are in each case a group of the formula $F_3C-CF_2-CH_2-O-CH_2-CH(C_2H_5)-$.

In the compositions shown in tables 1a and 1b, the compound of formula (II) is FTergent®212M (see above).

In the compositions shown in table 1 b, the compound of formula (III) is Lutensol® T08, a C13 oxo alcohol ethoxylate detergent, commercially available from BASF SE.

In the compositions shown in table 1b, the compound of formula (IV) is polyethylene glycol mono(tristyrylphenyl) ether (CAS® RN 99734-09-5).

In the compositions shown in table 1 b, the compound of formula (V) is trimethylolpropane ethoxylate triacrylate, average $M_n$=912 (CAS® RN 28961-43-5).

In the compositions shown in tables 1a and 1 b, the compound of formula (VI) is KF351 A (see above).

TABLE 1a

Compositions according to the invention and comparative composition

| Constituent | Composition | | | | |
| --- | --- | --- | --- | --- | --- |
|  | I1 | I1a | I2 | C1 | C2 |
| Compound of formula (I) [mg] | 20-30 | 20-30 | 40-50 | 50 | 0 |
| Compound of formula (II) [mg] | 40-50 | 40-50 | 0 | 0 | 80 |
| Compound of formula (VI) [mg] | 0 | 0 | 60-70 | 0 | 0 |
| Water [ml] | 100 | 100 | 100 | 100 | 100 |
| pH | 9.6 | 11 | 10 | 10 | 9.6 |
| Equilibrium surface tension [mN/m] | 22 | 22 | 27 | 27 | n.a. | n.a.: no data point available

The following compositions I1b, I2a, I3, I4 and I5 according to the invention and composition C3 as comparative composition not according to the invention, (also collectively referred to as the "test compositions" hereinafter) were prepared by conventional mixing of the components shown in table 1b. After mixing, the pH of the composition was adjusted by addition of a diluted aqueous ammonia solution, as required.

TABLE 1b

Compositions according to the invention and comparative composition

| Constituent | Composition | | | | | |
| --- | --- | --- | --- | --- | --- | --- |
| | I1b | I2a | I3 | I4 | I5 | C3 |
| Compound of formula (I) [mg] | 15-20 | 15-20 | 15-20 | 15-20 | 15-20 | 0 |
| Compound of formula (II) [mg] | 140-150 | 0 | 0 | 0 | 0 | 0 |
| Compound of formula (III) [mg] | 0 | 0 | 140-150 | 0 | 0 | 140-150 |
| Compound of formula (IV) [mg] | 0 | 0 | 0 | 140-150 | 0 | 0 |
| Compound of formula (V) [mg] | 0 | 0 | 0 | 0 | 140-150 | 0 |
| Compound of formula (VI) [mg] | 0 | 140-150 | 0 | 0 | 0 | 0 |
| Choline hydroxide [mg] | 0 | 0 | 0 | 0 | 0 | 15-20 |
| Water [ml] | 100 | 100 | 100 | 100 | 100 | 100 |
| pH | 9.6 | 9.6 | 9.6 | 9.6 | 9.6 | 10.4 |
| Equilibrium surface tension [mN/m] | 22 | 27 | 27 | 27 | 28 | 28 |

Example 2: Determination of the Critical Micelle Concentration (CMVC)

The CMVC was determined with a Kruess Tensiometer K 100 according to the plate method by measuring the equilibrium surface tension of a series of aqueous surfactant solutions having different concentrations. The resulting graph has usually two distinct regions. Below the CMVC, the equilibrium surface tension linearly depends in a wide range on the logarithm of the surfactant concentration. Above the CMVC, the equilibrium surface tension is more or less independent from the concentration of the surfactant. The data points of both regions can statistically be fitted by means of a simple linear regression. The CMVC is the intersection between the two linear regression lines fitted to the data in these regions.

Example 3: Equilibrium Surface Tension of the Compositions According to the Invention The equilibrium surface tension of aqueous surfactant solutions was determined at 25° C. according to DIN 53914: 1997-07 with a Kruess Tensiometer K 100 by the plate method.

The plate method uses a thin plate usually in the order of a few square centimeters in area. The plate is usually made from platinum having a high surface energy to ensure complete wetting. The force F on the plate due to wetting is measured via a tensiometer or microbalance and used to calculate the equilibrium surface tension using the Wilhelmy equation:

$$\gamma = \frac{F}{l \cdot \cos(\theta)}$$

where $l$ is the wetted perimeter of the Wilhelmy plate and $\theta$ is the contact angle between the liquid phase and the plate. The results are shown in tables 1a and 1b above.

From the results it can be seen that the compositions of the invention have equilibrium surface tensions of less than 30 mN/m and that preferred compositions of the invention have equilibrium surface tensions of less than 28 mN/m. The preferred composition I1 of the invention had an equilibrium surface tension of less than 25 mN/m.

Example 4: Storage Stability of the Compositions of the Invention

Test compositions were prepared as explained in example 1 above and stored for 9 weeks at 25° C. and 40% relative humidity. Before (i.e. directly after preparation of the compositions) and after this storage period, the test compositions were in each case analyzed for their CMC curves by means of surface tension measurement as described in example 2 above: the equilibrium surface tension was in each case measured for a series (i.e. more than ten) of aqueous surfactant solutions having different concentrations up to a 100-fold dilution (with deionized water). The results from this test are shown in table 2 below.

TABLE 2

Storage stability of compositions

| Equilibrium surface tension (up to 100-fold dilution, at CMC) | Composition | | |
| --- | --- | --- | --- |
| | I1 | I1a | I2 |
| Equilibrium surface tension directly after preparation [mN/m]: | 38 | 38 | 41 |
| Equilibrium surface tension after 9 weeks storage period [mN/m]: | 38 | 46 | 55 |

From the results of this example 4 it can be seen that composition I1 according to the invention showed the best storage stability under the storage conditions because its equilibrium surface tension did not change (increase) over the storage period. It could also be seen from the results of this experiment that the most suitable pH of the compositions of the present invention—for the purposes of optimized storage stability—is below pH 10, preferably at or below pH 9.6: for compositions of the invention with a pH at or below 9.6 an extremely low or no degradation of surfactants contained therein was found.

Example 5: Rinse Performance of the Compositions of the Invention and of Comparative Compositions by Measurement of Critical Dimension Si semiconductor test wafers were coated with a standard positive photoresist, followed by a standard sequence of process steps: baking of the photoresist, exposing to actinic radiation, developing the positive resist with an aqueous developer solution (containing 2.38 wt.-% TMAH) to create line-space/via-hole structures with a line width/via-hole diameter of 40 nm/70 nm on the wafer's surface, as is generally known in the art.

Line-space structures on the test wafers so created were then rinsed with compositions according to the invention I1, I1a, I1b, I2, I2a, I3, I4 and I5 and with comparative compositions C1, C2 and C3 (all compositions as defined in example 1 above, all experiments performed on separate semiconductor wafers per test composition) after the step of developing, without drying the liquid puddle on the wafer, followed by spraying each test composition (as rinse solutions) for 5 seconds at a flow rate of 10 ml/sec onto the test wafers' surfaces. For further comparison, said line-space structures were also rinsed under the same conditions (after the step of developing) with a standard aqueous defect reduction rinse solution of the prior art comprising an anionic, unbranched (linear) fluoroalkyl compound as single surfactant and which had a pH in the range of from 9.4 to 9.7 and a surface tension in the range of from 25 to 30 mN/m (referred to as "composition POR" hereinafter).

Subsequent to the rinses with the compositions defined here above, the Critical Dimensions (CD) "line width/via diameters" were measured by averaging 30 respective measured values in each case after the rinse by a by a critical dimension scanning electron microscope ("CD SEM"; KLA 8100XP by KLA Tencor, USA) in dense areas (i.e. repeating the pattern placement in both X and Y dimension), semi-dense areas (i.e. repeating the pattern placement in only X or Y dimension) and iso areas (i.e. every individual pattern was isolated from each other), and defined as the Critical Dimensions relevant for this experiment. The Critical Dimensions generally describes the size of the patterns present on a semiconductor wafer such as line/space width or diameters for the via/hole, more specifically, the smallest size shown on the semiconductor wafer.

The Critical Dimensions measured by the method as explained above after rinses with the compositions according to the invention I1, I1a, I1b, I2, I2a, I3, I4 and I5 with comparative compositions C1, C2 and C3 and with the composition POR were collected and compared by the CD software of the scanning electron microscope. Then, the Critical Dimension differences between the compositions according to the invention I1, I1a, I1b, I2, I3, I4 and I5 and comparative compositions C1, C2 and C3 on the one hand and the composition POR on the other hand were calculated by the software and presented in the format of "maximum Critical Dimension proximity bias to composition POR" (i.e. the maximum CD deviation between the wafer rinsed with a test composition and the wafer rinsed with the standard rinse solution composition POR) in the area of interest (dense, semi-dense or iso, as shown in tables 3a and 3b below). "Maximum Critical Dimension proximity bias" values equal to or below 2 nm in relation to the respective Critical Dimension values measured with standard composition POR indicate preferred rinsing results achieved with the test compositions. The values for "Maximum Critical Dimension proximity bias" should be as low as possible and a value of 2 nm thereof is a preferred upper threshold which is acceptable for further processing where the performance of the final device or product will not be limited due to e.g. a poor cleaning or rinsing result. The results from this test are shown in tables 3a and 3b below.

TABLE 3a

Measurement of Critical Dimensions-Part A

| Critical Dimension | Composition | | | | |
| --- | --- | --- | --- | --- | --- |
|  | I1 | I1a | I2 | C1 | C2 |
| Maximum CD proximity bias to composition POR in dense area (width change of the pattern in nm) | 1.8 | 2.5 | 1.6 | 3.5 | 1.4 |
| Maximum CD proximity bias to composition POR in semi-dense area (width change of the pattern in nm) | 1.9 | 3 | 1.4 | 3.2 | 3.0 |

TABLE 3a-continued

Measurement of Critical Dimensions-Part A

| Critical Dimension | Composition | | | | |
| --- | --- | --- | --- | --- | --- |
|  | I1 | I1a | I2 | C1 | C2 |
| Maximum CD proximity bias to composition POR in iso area (width change of the pattern in nm) | 0.7 | 1.9 | 2.1 | 2.8 | 3.4 |

TABLE 3b

Measurement of Critical Dimensions-Part B

| Critical Dimension | Composition | | | | | |
| --- | --- | --- | --- | --- | --- | --- |
|  | I1b | I2a | I3 | I4 | I5 | C3 |
| Maximum CD proximity bias to composition POR in semi-dense area (width change of the pattern in nm) | 1.4 | 1.7 | 2.0 | 2.0 | 1.8 | 6.5 |

From the results of this example 5 it can be concluded that a composition according to the invention (comprising as primary surfactant an ionic compound of formula (I) and as secondary surfactant at least one non-ionic compound comprising one or more polyalkyloxy and/or polyalkylenoxy groups, i.e. composition I1, I1a, I1b, I2, I2a, I3, I4 or I5) shows better rinse results (probably due to a higher potential for defect reduction) than a comparative composition comprising only an ionic compound of formula (I) (i.e. comparative composition C1) or a comparative composition comprising only a non-ionic compound comprising one or more polyalkyloxy and/or polyalkylenoxy groups (i.e. comparative composition C2), thus illustrating a synergetic effect of the compositions of the invention comprising both a primary surfactant and a secondary surfactant, as defined herein. The least favourable results in this test model were obtained with comparative test composition C3 comprising choline hydroxide as first surfactant and as a second surfactant a compound of formula III. The comparative test composition C3 clearly failed to meet the success criteria of the present test model ("Maximum Critical Dimension proximity bias" values equal to or below 2 nm in relation to the respective Critical Dimension values measured with standard composition POR) and is therefore not regarded as suitable for cleaning or rinsing a product comprising a substrate and supported thereon a patterned material layer having line-space structures with a line width of 50 nm or below.

Best results were achieved with the composition I1 according to the invention, showing the best rinsing results in the test setting.

Example 6: Liquid Particle (Micelle) Content of the Compositions

Compositions I1 (according to the invention) and C1 (comparative composition) were prepared as explained in example 1 above. Both compositions were filtrated through a HDPE (high density poly ethylene) filter (0.02 μm pore size, Entegris) for 24 hrs. After filtration, liquid particle content of both compositions was determined by light scattering using a Rion KL 27 particle counter (Rion Co., Ltd.

JP), for the method see e.g. K. Kondo et al. "Measurement of Particles in Liquid Materials Using the Light Scattering Method", The proceeding of "Interfacial Nano Electrochemistry, March 2013".

Generally, light scattering occurs when a sample introduced through the nozzle of a particle counter instrument is irradiated with light and then the particles pass through the light. The scattered light is detected by the photo detector and is converted into electrical signals which can be analyzed: the size of the electrical signals represents the particle size and the frequency of scattered-light detection represents the particle count (number of particles).

The data was sampled in each case by averaging three single measurement values per test composition. The results of this experiment are shown in table 4 below.

TABLE 4

Liquid particle count in the test compositions

| Particle size [µm] | I1 [particles/ml] | C1 [particles/ml] |
| --- | --- | --- |
| 0.02 | 155 | Exceeding measuring range |
| 0.05 | 84 | Exceeding measuring range |
| 0.1 | 37 | Exceeding measuring range |
| 0.2 | 8 | Exceeding measuring range |
| 0.5 | 1 | Exceeding measuring range |

The term "Exceeding measuring range" in table 4 means that the number of particles detected by the particle counter instrument was too high to be counted in the experimental setting.

From the data shown in table 4 above it can be seen that a composition according to the invention contains significantly less particles than a comparative composition not according to the invention. These particles mainly comprise partially soluble surfactant aggregates ("micelles") which can pass through the pore of filter upon squeezing. Therefore, solid (hard) particles were filtered but surfactant aggregates were not (or to a much lesser extent) filtered in this experiment. However, the particles not filtered (surfactant aggregates) can have a negative impact on the cleaning or rinsing effect of a respective composition.

Example 7: Equilibrium Contact Angle of the Compositions of the Invention on a Product Comprising a Substrate A composition according to the invention, composition "1 b" (similar to composition I1 of example 1, but with a lower collective concentration of compound of formula (I) and compound of formula (II) of 0.05 wt.-% relative to the total mass of the composition) and a comparative composition C1 (not according to the invention) were prepared as explained in example 1 above.

A flat semiconductor wafer coated with a common unexposed positive photoresist ("substrate") was placed on the horizontal support of a Krüss drop shape analyzer (type DSA 100, Krüss GmbH, Germany), fitted with an optical screen during usage. For adding the test compositions, a microliter syringe was positioned at the center of the substrate and connected to the micromanipulator of the drop shape analyzer. The micromanipulator is used to adjust the position of the needle tip of the syringe carefully above the wafer. The tip of the syringe was positioned a few micrometers away from the surface of the substrate to eliminate impact effect when a droplet of a test composition is released. The droplet volume was selected in each case to be 2 µl so that gravity effects were negligible. The drop was recorded and applied on the substrate with the defined volume by exact movement of the syringe of the contact angle meter using a charge-coupled device (CCD) camera, and equilibrium contact angles were measured directly ("0 seconds") after the test composition had been applied onto the substrate's surface and again 10 seconds thereafter. The results from this experiment are shown in table 5 below.

TABLE 5

Equilibrium contact angles of compositions

| Composition | Contact angle directly (0 s) after application onto substrate | Contact angle 10 s after application onto substrate |
| --- | --- | --- |
| I1b | 23° | 17.3° |
| C1 | 42° | 41.3° |

From the above results in table 5 it can be seen that the equilibrium contact angle of a composition according to the invention is much smaller than the contact angle of a comparative composition not according to the invention, showing that the composition according to the invention has a better wettability (i.e. can better wet) the substrate's surface (i.e. the photoresist-coated surface of a semiconductor wafer) than a comparative composition not according to the invention. Compositions which show a good wettability of a substrate usually achieve better cleaning or rinsing results on said substrate and/or better defect reduction results than compositions which show a poorer wettability of said substrate.

Example 8: Rinse Performance of the Compositions of the Invention and of Comparative Compositions Under the Aspect of Pattern Collapse Si semiconductor test wafers were coated with a standard positive photoresist, followed by a standard sequence of process steps: baking of the photoresist, exposing to actinic radiation, developing the positive resist with an aqueous developer solution (containing 2.38 wt.-% TMAH) to create line-space/via-hole structures with a line width/via-hole diameter of 40 nm/70 nm on the wafer's surface, as is generally known in the art.

Line-space structures on the test wafers so created were then rinsed with compositions according to the invention I1b, I2a, I3, I4 and I5 and with comparative composition C3 (all compositions as defined in example 1 above, all experiments performed on separate semiconductor wafers per test composition) after the step of developing, without drying the liquid puddle on the wafer, followed by spraying each test composition (as rinse solutions) for 5 seconds at a flow rate of 10 ml/sec onto the test wafers' surfaces.

Subsequent to the rinses with the compositions defined here above, the test wafers were coated with a thin protective layer of platinum (as is known in the art, to enhance surface conductivity, thickness of the platinum layer about <0.5 nm). Then, 5 test areas of 10 µm² each were randomly selected per test wafer and inspected for the number of pattern collapses of the line-space/via-hole structures previously created (see above) per test area by top down (or slightly tilted) view scanning electron microscopy (SEM) with a Hitachi SU 8220 scanning electron microscope. The numbers of collapsed patterns from the 5 test areas on a test wafer were counted and an average of the numbers obtained was rounded off and recorded as a result (per test wafer).

The results of this experiment are shown in table 6 below.

TABLE 6

Inspection for pattern collapses of line-space structures after rinses with the test compositions

| Critical Dimension | Composition | | | | | |
|---|---|---|---|---|---|---|
|  | I1b | I2a | I3 | I4 | I5 | C3 |
| Average number of pattern collapses of line-space structures in 10 μm² test areas after rinses with the test compositions | 0 | 5 | 2 | 6 | 10 | 15 |

From the results of this example 8 as shown above in table 6 it can be seen that the compositions according to the invention, comprising as primary surfactant an ionic compound of formula (I) and as secondary surfactant at least one non-ionic compound comprising one or more polyalkyloxy and/or polyalkylenoxy groups (i.e. composition I1b, I2a, I3, I4 or I5), all show significantly better rinse results on a patterned material layer having line-space structures with a line width of 50 nm or below than a comparative composition (i.e. comparative composition C3) comprising an ionic compound not according to the invention (i.e. choline hydroxide) and as secondary surfactant at least one non-ionic compound comprising one or more polyalkyloxy and/or polyalkylenoxy groups, i.e. rinses with said compositions according to the invention resulted in a significantly lower number of pattern collapses of the rinsed structures than a rinse with said comparative composition.

The compositions I1b, I2a, I3, I4 according to the invention showed particularly good rinse results on a patterned material layer having line-space structures with a line width of 50 nm or below in this test method, with a particularly low number of pattern collapses of the rinsed structures. The compositions I1b, I2a, I3, I4 therefore represent preferred compositions according to the present invention.

The composition I1b according to the invention showed the best rinse results on a patterned material layer having line-space structures with a line width of 50 nm or below in this test method, with no pattern collapses of the rinsed structures at all. The composition I1b therefore represents a particularly preferred composition according to the present invention.

The invention claimed is:

1. A composition for cleaning or rinsing a product, comprising:

a primary surfactant comprising an ionic compound of formula (I), $$\text{(I)}$$

wherein:

X is a cation, one of Y1 and Y2 is an anionic polar group and the other is hydrogen, and each group of Z1, Z2 and Z3 is, independent of each other, a branched or unbranched $C_{1-10}$-alkyl group or a group of the structure $R^i-\{A[C(R^1)(R^2)-]_c[-C(R^3)(R^4)-]_d\}_e-$, wherein:

$R^1$, $R^2$, $R^3$ and $R^4$ are, independent of each other, hydrogen or a branched or unbranched $C_{1-4}$-alkyl group, $R^i$ is a branched or unbranched $C_{1-10}$-fluoroalkyl group, A is oxygen, sulfur and/or —N(H)—, c is an integer in the range of from 0 to 10, d is an integer in the range of from 0 to 10, e is an integer in the range of from 1 to 5, c and d are not both 0, and at least one of the groups Z1, Z2 or Z3 is a group of the structure $R^i-\{A[-C(R^1)(R^2)-]_c[-C(R^3)(R^4)-]_d\}_e-$; and a secondary surfactant comprising at least one non-ionic compound comprising one or more polyalkyloxy and/or polyalkylenoxy groups selected from the group consisting of a compound of formula (II) selected from the group consisting of a compound of formula (IIa):

$$\text{(IIa)}$$

and a compound of formula (IIb):

$$\text{(IIb)}$$

wherein $R^6$ is a branched or unbranched $C_{2-6}$-alkylen group, $R^{18}$ is hydrogen or a branched or unbranched $C_{1-4}$-alkyl group, and l is an integer in the range of from 5 to 30;

a compound of formula (IV),

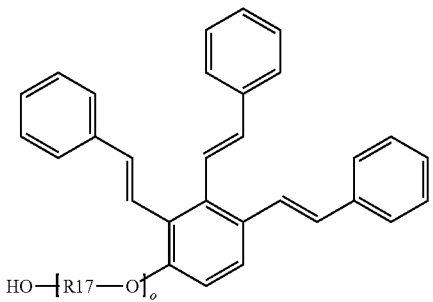

(IV)

wherein
$R^{17}$ is a branched or unbranched $C_{2-6}$-alkylen group, and
o is an integer in the range of from 5 to 30;
a compound of formula (V),

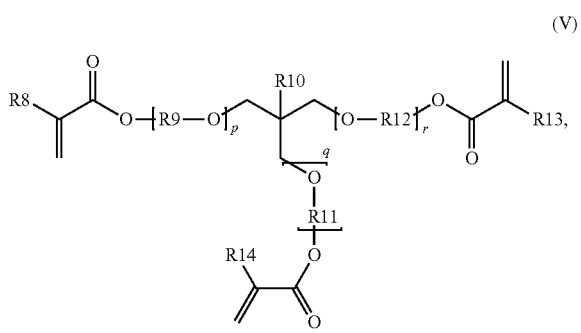

(V)

wherein
$R^8$, $R^{13}$ and $R^{14}$ are each independent of each other, hydrogen or methyl,
$R^9$, $R^{11}$ and $R^{12}$ are each independent of each other a branched or unbranched $C_{2-6}$-alkylen group,
$R^{10}$ is a branched or unbranched $C_{1-4}$-alkyl group, and
p, q and r are each independent of each other an integer in the range of from 2 to 25; and
a compound of formula (VI),

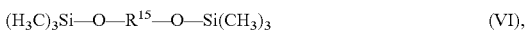

(VI), wherein
$R^{15}$ consists of
a number in the range of from 1 to 100 of repeating units of formula (VII):

(VII), and
a number in the range of from 1 to 100 of repeating units of formula (VIII):

(VIII), wherein $R^{16}$ is a group comprising one or more ethylene glycol groups and/or one or more propylene glycol groups, and
wherein the repeating units of formula (VII) and the repeating units of formula (VIII) are arranged randomly or in random alternating blocks, each block comprising two or more repeating units of formula (VII) or of formula (VIII) per block.

2. The composition according to claim 1,
wherein each group Z1, Z2 and Z3 is independent of each other a group of the structure $R^i$-{A[-C($R^1$)($R^2$)—]$_c$[—C($R^3$)($R^4$)—]$_d$}$_e$—, and/or
wherein at least one non-ionic compound is a compound of formula (II).

3. The composition according to claim 1, wherein in the ionic compound of formula (I),
X is a monovalent cation not comprising a metal, selected from the group consisting of a proton and a group $NR_4^+$,
wherein each R is independently selected from the group consisting of H, a branched $C_{1-6}$-alkyl group, and an unbranched $C_{1-4}$-alkyl group;
one of Y1 and Y2 is an anionic polar group selected from the group consisting of $COO^-$, $SO_3^-$, $—(O)SO_3^-$, $—PO_3^{2-}$ and $—(O)PO_3^{2-}$, and the other is hydrogen; and
each group Z1, Z2 and Z3 is, independent of each other, a group of the structure $R^i$-{A[C($R^1$)($R^2$)]$_c$[C($R^3$)($R^4$)]$_d$}$_e$—.

4. The composition according to claim 1, wherein in the compound of formula (I)
X is selected from the group consisting of a proton and a group $NR_4^+$, wherein each R is independently selected from the group consisting of a H, a branched $C_{1-6}$-alkyl group, and an unbranched $C_{1-4}$-alkyl group,
one of Y1 and Y2 is $—SO3^-$, and the other is hydrogen,
each group Z1, Z2 and Z3 is, independent of each other, a group of the structure $F_3C(CF_2)_a(CH_2)_b${O[—C($R^1$)($R^2$)—]$_c$[C($R^3$)($R^4$)—]$_d$}$_e$—, wherein:
a is an integer in the range of from 0 to 2, and
b is an integer in the range of from 1 to 6.

5. The composition of claim 1, further comprising water.

6. The composition of claim 1,
wherein a mass ratio of the compound of formula (I) to the compound of formula (II) is in the range of from 1:4 to 1:1, and/or
wherein a sum of the total amount of compound of formula (I) and the total amount of compound of formula (II) present in the composition is in the range of from 0.01 wt.-% to 0.5 wt.-%, based on the total weight of the composition.

7. The composition according to claim 1,
wherein an equilibrium surface tension of the composition is less than 35 mN/m, as measured at 25° C. according to DIN 53914:1997-07 with a Kruess Tensiometer K 100 by the plate method, and/or
wherein a pH of the composition is in a range of from 4.0 to 11.0.

8. A method of using the composition of claim 1, comprising:
cleaning or rinsing a product by contacting the product with the composition,
wherein the product comprises a substrate supporting a patterned material, the patterned material having line-space structures with a line width of 50 nm or below.

9. The method according to claim 8,
wherein the cleaning or rinsing is part of a process of making integrated circuit devices, optical devices, micromachines, or mechanical precision devices, and/or
wherein the substrate is a semiconductor substrate.

10. The method according to claim 8, wherein the composition is used for cleaning or rinsing so that
a pattern collapse is prevented or reduced,
a line edge roughness is reduced, watermark defects are prevented or removed,
a photoresist-swelling is prevented or reduced,
blob defects are prevented or reduced, and/or
particles are removed.

11. The method according to claim 8, wherein:
the patterned material is at least one selected from the group consisting of a patterned developed photoresist layer, a patterned barrier material layer, a patterned multi-stack material layer, and a patterned dielectric material layer;
the patterned material has photoresist structures having an aspect ratio greater than 2 and/or patterned multi-stack line/space structures having an aspect ratio greater than 2; and/or
the line-space structures have a line width of 32 nm or below.

12. A method of making a cleaned or rinsed product, the method comprising:
preparing or providing a product comprising a substrate supporting a patterned material layer, the patterned material layer having line-space structures with a line width of 50 nm or below;
preparing or providing a composition as defined in claim 1; and
cleaning or rinsing the product with the composition to produce a cleaned or rinsed product.

13. The method according to claim 12, further comprising:
providing a photoresist layer on a substrate, wherein the photoresist layer is an immersion photoresist layer, an EUV photoresist layer or an electron beam photoresist layer;
exposing the photoresist layer to actinic radiation through a mask with or without an immersion liquid to produce an exposed photoresist layer;
developing the exposed photoresist layer with a developer solution to obtain a pattern having line-space structures with a line width of 50 nm or below, thus producing the substrate supporting the patterned material layer; and
optionally drying the cleaned or rinsed product.

* * * * *